Figure 1:
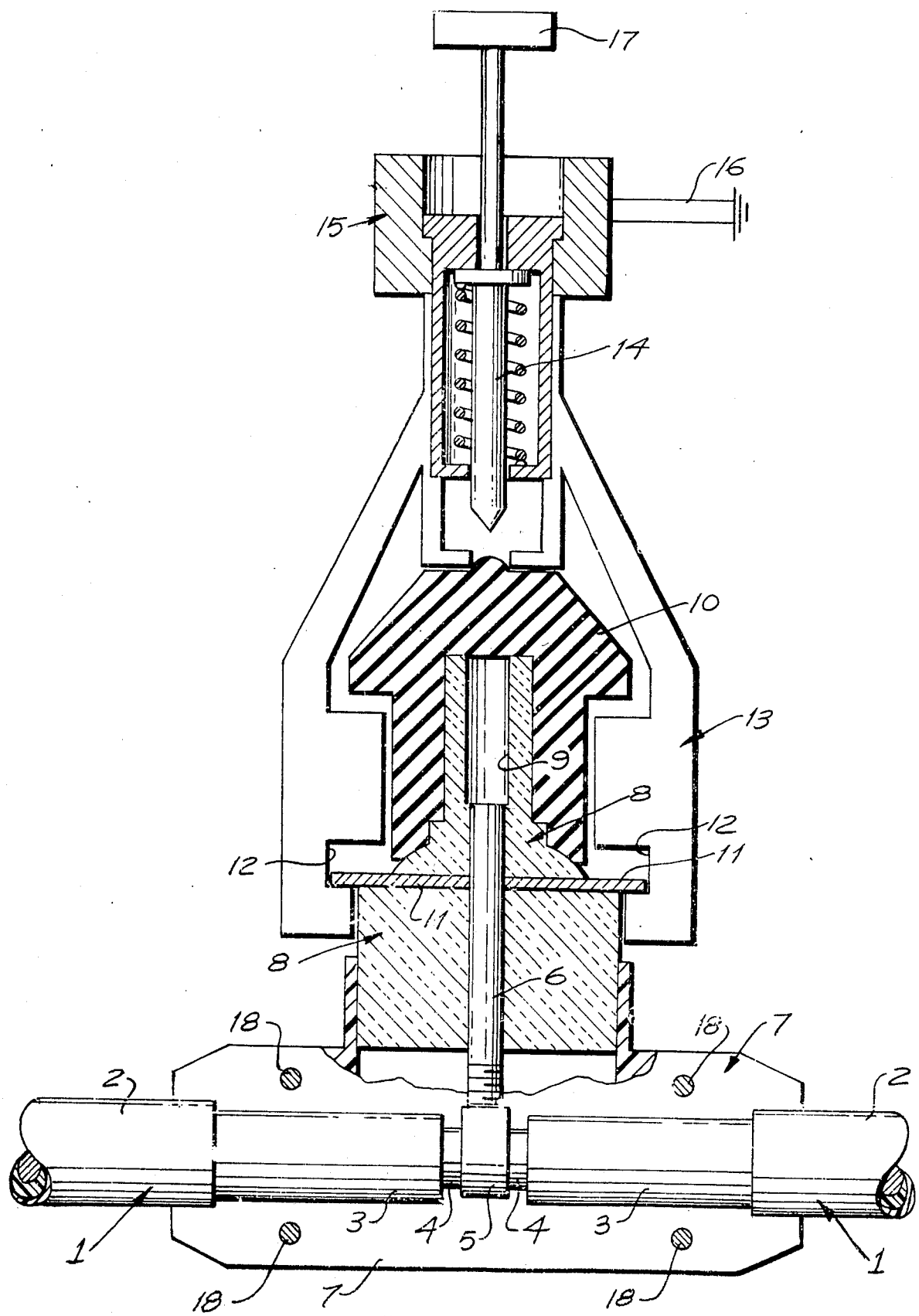

United States Patent [19]

Wilson

[11] Patent Number: 4,660,909

[45] Date of Patent: Apr. 28, 1987

[54] REMOTE GROUNDING DEVICE FOR SUBTERRANEAN POWER SYSTEMS

[76] Inventor: Daniel P. Wilson, 4846 E. Mountain View Dr., San Diego, Calif. 92116

[21] Appl. No.: 809,422

[22] Filed: Dec. 16, 1985

[51] Int. Cl.$^4$ .............................................. H01R 4/66
[52] U.S. Cl. ................................ 339/14 L; 174/5 SG
[58] Field of Search ................... 339/14 R, 14 L, 96, 339/253 L, 264 L, 266 G, 266 L; 174/5 SG, 6, 71 C

[56] References Cited

U.S. PATENT DOCUMENTS 3,461,419  8/1969  Link ............................. 174/71 C X
3,976,347  8/1976  Cooke et al. ..................... 339/96 X

FOREIGN PATENT DOCUMENTS 507839  11/1933  Fed. Rep. of Germany ... 174/5 SG

Primary Examiner—Eugene F. Desmond
Attorney, Agent, or Firm—Selwyn S. Berg

[57] ABSTRACT

A device is described which is used to ground power distribution subterranean cables. A grounding module may be positioned over a connector to the power cables. A remote trigger then fires a probe through an insulating cap on the connector to make a ground circuit from the cable through the connector and probe to a grounding clamp.

1 Claim, 1 Drawing Figure

REMOTE GROUNDING DEVICE FOR SUBTERRANEAN POWER SYSTEMS

BACKGROUND

Electric power cables require occasional service and maintenance. There are various instruments and test equipment for testing subterranean cables and appurtenances, to verify their status, (energized or de-energized). All instruments and test equipment are unreliable to some degree. These power lines are fused in excess of 15,000 volts and 600 amps, which are not only lethal, but explosive, if shorted. In the interest of a less cluttered environment, these power cables are now placed underground. In the past, the overhead cables were grounded by a remote device on the end of a six foot hotstick prior to any work being done. If the power circuit were still alive, the worker had space and distance to protect himself from the explosive consequences of grounding the power system. In the subterranean power distribution system, no such latitude in space and distance exists.

Underground power distribution systems have unique hardware using high dielectric hard rubber and polyethylene encasing the conductors of splices, terminations, and or cables. The device used to ground a power system is called a "spiking tool". The spiking tool currrently used is a hydraulically operated device that drives a pointed spike through the insulation of splices, terminations, and or cables into the conductor. In the process, a $50 to $250 replaceable item is damaged beyond repair. If the terminal is de-energized, the spike is removed, leaving the system ungrounded, and workmen unprotected from inadvertent sources of voltage.

A new system is proposed where a grounding probe is driven into a low cost (13) replaceable cap located on the grounding module. The probe is contained in a frame (the grounding mechanism) which is guided by a lineman to engage the cap on the grounding module. A remotely operated impulse system drives the probe into a positive contact located inside the grounding module which is connected to the conductor. Electrical utility industry standards dictate that conductors to be worked on must be grounded on both sides of the work area, and that the grounds not only be visible from the work space but that they remain in place until work is complete. Prior to the cable being energized or on a retrofit, the grounding module would be installed a reasonable working distance on both sides of the splices or terminations that will require servicing.

SUMMARY

Underground electrical power distribution systems have terminal points known as splices or terminations, where the cables may be serviced. On both sides of each service point, a grounding module connector will be installed. This grounding module contains a conductor buss that makes physical contact with the power line. It is inside an insulating sheath that comes in two halves which is attached to the main cable. The insulation on the main cable is stripped and dressed, and a buss conductor is connected to the cable conductor. The buss conductor is enclosed in a standard insulated reducing tap plug. This tap plug is capped with an insulating receptacle cap. All the above components are held together by the insulating sheath.

The grounding mechanism has a frame which has a groove which engages a lip on the reducing tap plug and centers the frame. The probe is centered in the top of the frame. When the rounding mechanism is triggered, the probe is driven through the cap into a tube which guides the probe to contact with the buss. The probe and the frame are grounded, and the cable conductor is grounded by contact with the driven probe. The probe may be driven by explosive charge, loaded spring, expanding gas, or any means of rapid power drive of the probe to assure a rapid penetration of the cap and positive contact with the buss.

DRAWING

FIG. 1—grounding module showing the dressed cable, the module, and grounding mechanism frame, all mated for grounding operation.

EMBODIMENT

There are three major entities in the grounding module. The first entity is the main power cable (1), which must be dressed in such a manner as to accept the grounding module. This dressing is accomplished by stripping off the outer jacket (2), and then cutting through the cable insulation (3) to expose the cable conductor (4). There will be gauges and shields that would help the lineman mark and execute the cuts and stripping to assure that the cable is dressed to accept the module in a secure manner.

The grounding module is an assembly of several parts. The lineman connects the power buss (6) to the cable conductor (4) by a means of conductive clamp (5). One means of conductive attachment could be a clamp which wraps around the cable conductor and attaches to the buss. The buss being an internal part of the reducing tap plug (8) is threaded into the conductive clamp. The reducing tap plug is a commercially available power insulator designed to accept and mate with the clamp. The buss (6) is concentrically located in the plug (8), and the plug (8) is rigidly connected to the dressed cable by the insulating sheath (7), which comes in two mating halves, held together by a multiplicity of locking means (18) which may be nuts and bolts. The grounding module assembly is then completed by covering the top of the reducing plug (8) female connector, which will be the probe path void (9), with an insulating receptacle cap (10). The cap (10) and the plug (8) are both commercially available in several forms and sizes, and are only described and illustrated in respect to its salient features. The plug has a lip (11), and cylindrical symmetry with reduced diameter in its upper section in respect to its lower section. Concentrically located are two contiguous tubes of different diameter. In this case, the lower tube holds the buss (6), and the upper tube is the probe path void (9). The cap (10) fits over the upper section of the plug to insulate and protect the contiguous tubes from dampness, dirt, and external contact. The cap (10) is of a rubber or plastic material. Most of the plug (8) is of a hard insulating material, except for portions which must be reinforced for strength, like the lip (11), which has a metal case. The grounding module as herein defined consists of the insulating sheath (7), and its locking means (18), the reducing tap plug (8), and the insulating receptacle cap (10). The lineman connects this grounding module to the cable during installation.

When maintenance must be performed at an underground terminal, the lineman must ground the system.

Electric utility standard work methods dictate visible grounds on both sides of the work area. This may be done remotely with the grounding mechanism. The grounding mechanism has a handle means (17) which permits the frame (13) to be lowered into the subterranean work space (manholes and vaults) to engage the grounding module. This is best accomplished by guiding the frame (13) so that a groove (12) in the frame (13) engages the lip (11) of the plug (8). The groove and the lip guide the frame so as to center the probe (14) over the probe path void (9). The frame (13) has been grounded by a grounding means (16), which could be a cable and clamp which may be attached to some ground point. The power drive is cocked or loaded. The lineman exits the work space. A remote trigger is pulled which fires the power drive means (15) and drives the probe (14) through the cap (10) into the void (9) which then positively contacts the buss (6), assuring a ground connection. The power drive illustrated uses a compressed spring.

I claim:

1. A remote grounding device for subterranean power cable of an insulated conducting cable which comprises a grounding module and a grounding mechanism, said grounding module is an assembly of a power buss, an insulation sheath, a reducing tap plug and an insulating receptacle cap, said power buss being intimately connected to the conducting cable by a means of an attachment, said reducing tap plug fitting concentrically over said power buss and having a tubular probe path void contiguous and in-line to said power buss and a lip around the outer periphery of said reducing tap plug, said insulating receptacle cap covering the tubular void, said insulating sheath covering and holding said reducing tap plug and power cable by a multiplicity of locking means, and a grounding mechanism assembly of a frame, a probe, a power drive means, a grounding means, a handle means, said frame having a groove and being open on one side, said probe being geometrically located on said frame at a central point, so that when said groove engages said lip said probe is directly in line with said probe path void, said probe being of smaller diameter than said probe path void, said power drive means coupled to said probe on said frame, grounding means attached to said probe at one extremity, and said handle means attached to said frame, so that the handle directs the frame onto the reducing tap plug by the lip and groove so the probe is above the center of the probe path void, when the power drive means is excited and the other extremity of the grounding means is grounded, the probe penetrates the insulating receptacle cap and contacts the power buss, resulting in a grounded power cable.

* * * * *